(12) United States Patent  
Li

(10) Patent No.: US 8,272,852 B2  
(45) Date of Patent: Sep. 25, 2012

(54) FAN ASSEMBLY

(75) Inventor: Zhan-Yang Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 434 days.

(21) Appl. No.: 12/712,303

(22) Filed: Feb. 25, 2010

(65) Prior Publication Data

US 2011/0135461 A1   Jun. 9, 2011

(51) Int. Cl.
F04D 25/08 (2006.01)
F04D 29/58 (2006.01)

(52) U.S. Cl. ............... 417/423.14; 417/423.15; 361/695

(58) Field of Classification Search ............... 417/423.1, 417/423.14, 423.15; 361/695; 338/68, 74, 338/160, 161, 163
See application file for complete search history.

(56) References Cited

U.S. PATENT DOCUMENTS

| | | | | | |
|---|---|---|---|---|---|
| 4,369,424 | A | * | 1/1983 | Miyamoto | 338/161 |
| 4,426,634 | A | * | 1/1984 | Okuya et al. | 338/161 |
| 4,435,691 | A | * | 3/1984 | Ginn | 338/125 |
| 5,636,103 | A | * | 6/1997 | Bushner | 361/695 |
| 5,673,015 | A | * | 9/1997 | Imamura et al. | 338/176 |
| 5,825,279 | A | * | 10/1998 | Yagi | 338/176 |
| 6,592,327 | B2 | * | 7/2003 | Chen et al. | 415/213.1 |
| 7,537,480 | B2 | * | 5/2009 | Li | 439/485 |
| 7,688,585 | B2 | * | 3/2010 | Yin | 361/695 |
| 7,697,287 | B2 | * | 4/2010 | Yin | 361/695 |
| 7,699,692 | B2 | * | 4/2010 | Yin | 454/184 |
| 7,713,025 | B2 | * | 5/2010 | Chen et al. | 415/213.1 |
| 8,075,248 | B2 | * | 12/2011 | Yin et al. | 415/60 |
| 2008/0101019 | A1 | * | 5/2008 | Tao | 361/695 |
| 2009/0009961 | A1 | * | 1/2009 | Li | 361/687 |
| 2009/0284919 | A1 | * | 11/2009 | Tao et al. | 361/695 |
| 2010/0098561 | A1 | * | 4/2010 | Horng et al. | 417/354 |
| 2011/0157817 | A1 | * | 6/2011 | Li | 361/679.48 |

FOREIGN PATENT DOCUMENTS

JP   03245502 A  * 11/1991
JP   03284803 A  * 12/1991

* cited by examiner

Primary Examiner — Devon Kramer
Assistant Examiner — Bryan Lettman
(74) Attorney, Agent, or Firm — Altis Law Group, Inc.

(57) ABSTRACT

A fan assembly includes a fan, a first plate, and a rack. The fan includes at least one power line. The first plate is mounted on one side of the fan. The first plate mounts an adjustable resistor assembly thereon. The adjustable resistor assembly connects the at least one power line to a power source. The adjustable resistor assembly includes a first resistor and a slider. The slider includes a conducting point. One end of the first resistor is connected to the power source. The at least one power line of the fan is connected to the conducting point. The slider is capable of sliding on the first side plate to have the conducting point contacting different parts of the first resistor to vary the resistor value of the adjustable resistor assembly. The rack is capable of receiving the fan with the first plate mounted therein.

8 Claims, 4 Drawing Sheets

FAN ASSEMBLY

BACKGROUND

1. Technical Field

The present disclosure relates to heat dissipating apparatuses, and more particularly, to a fan assembly.

2. Description of Related Art

In working computer systems, a large amount of heat is generated from the electric elements of the computer system. If the heat is not dissipated efficiently, the electric elements may be damaged. Therefore, more efficient heat-dissipating devices are desirable.

A fan is a conventional means to dissipate heat from the computer system. A rack is provided for receiving a fan. A plurality of through holes is defined in the rack. When installing the fan to a plate of the computer system, the fan is received in the rack. The rack together with the fan is placed on the plate, which defines a plurality of screw holes. The through holes of the rack align with the screw holes of the plate. The fan is enclosed by the rack and the plate. A plurality of screws extend through the through holes, and are screwed into the corresponding screw holes. The fan is thereby secured to the plate of the computer system. With this mounting means, it is well known within the art, that assembly and disassembly of the fans can be inconvenient.

Therefore, there is chamber for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
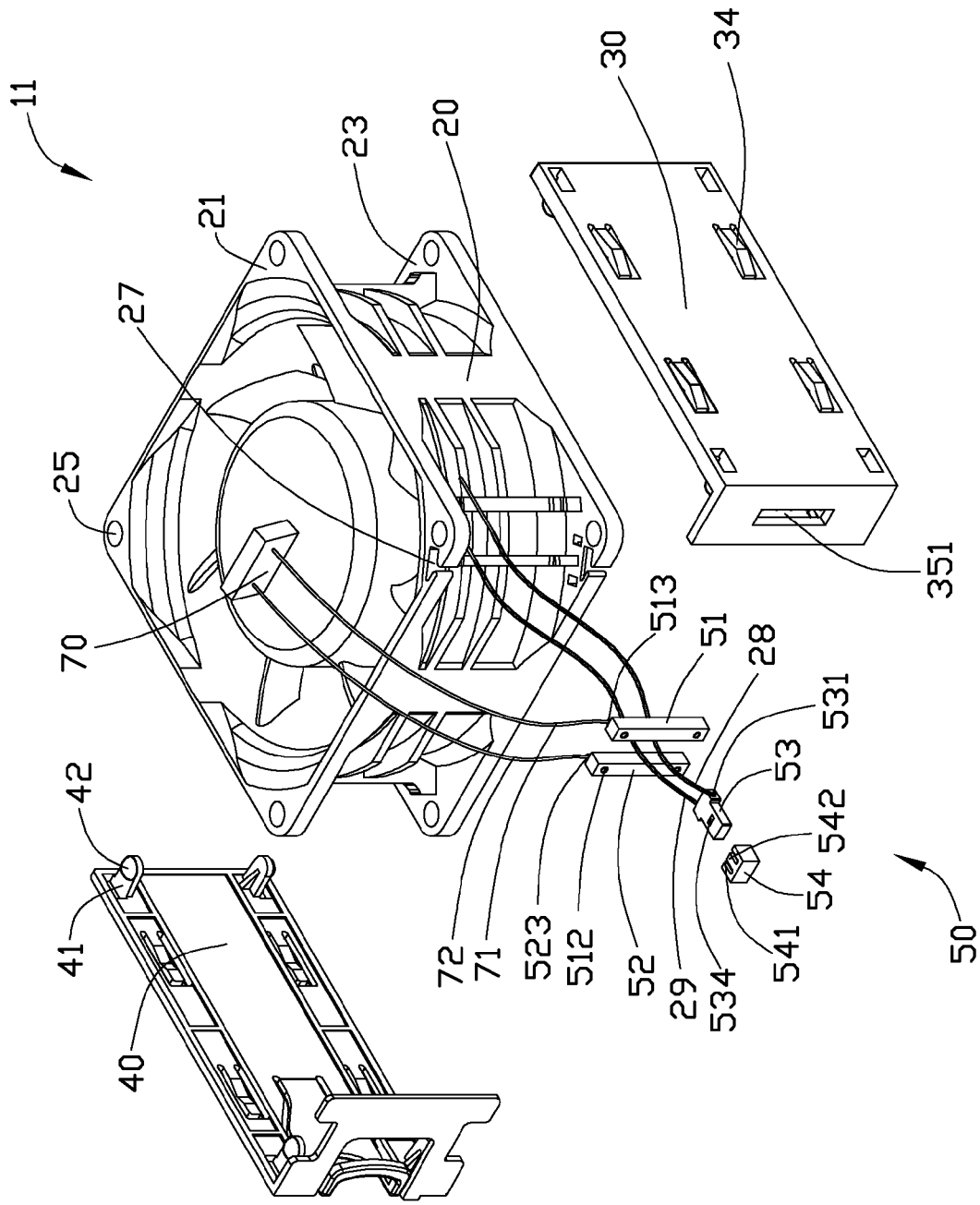
FIG. 1 is an exploded, isometric view of a fan, a first plate, and a second plate in accordance with an exemplary embodiment of the present disclosure.
Figure 4:
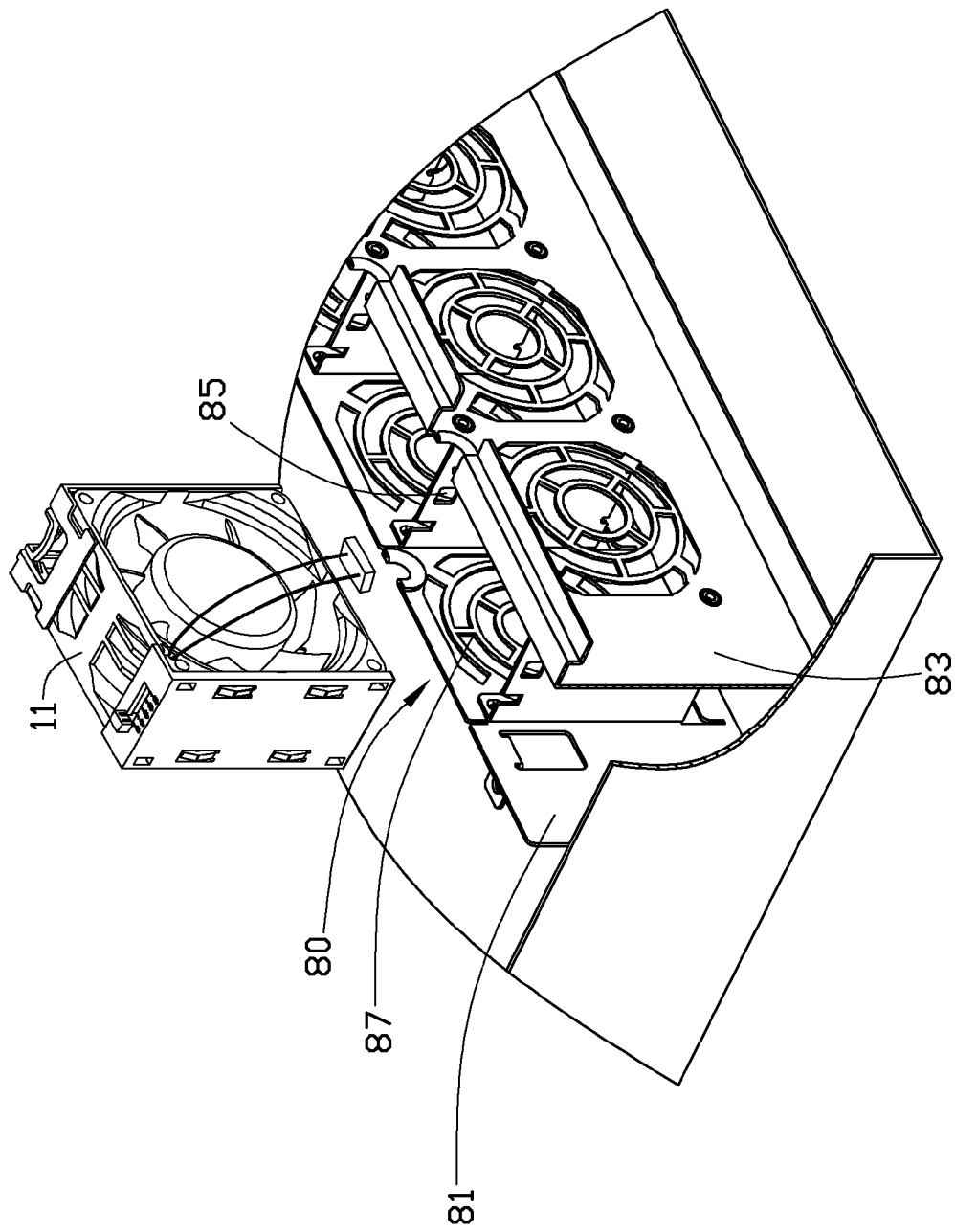
FIG. 4 is an isometric view of the fan, the first plate, the second plate of FIG. 1 and a rack.

Referring to FIGS. 1 and 4, a fan assembly includes a fan 11, a rack 80, a first plate 30, and a second plate 40. The fan assembly is configured to be mounted in a computer enclosure. The fan 11 includes a first wall 21 and a second wall 23. The corners of each of the first wall 21 and second wall 23 define four fixing holes 25. A line outlet 27 is defined in the first wall 21. Power lines 28 and 29 are connected with the fan 11.

Figure 2:
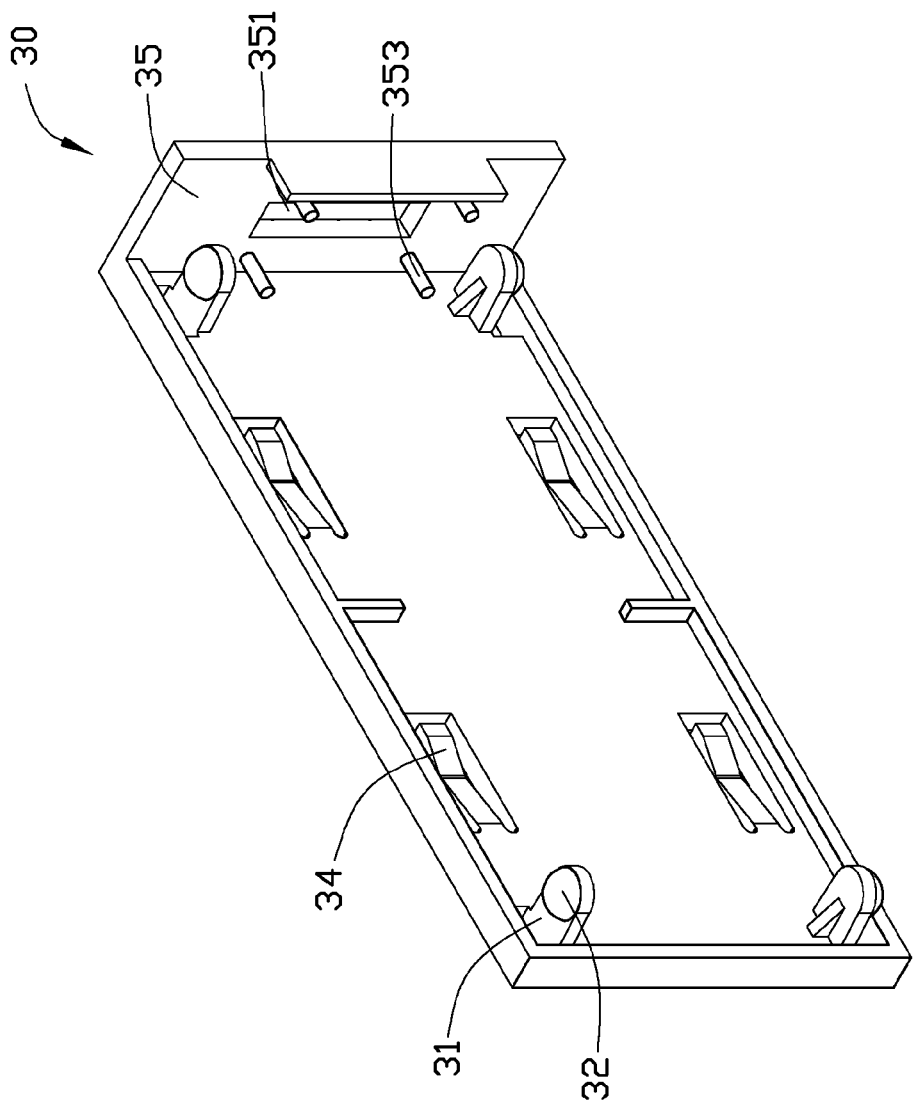
FIG. 2 is an isometric view of the first plate of FIG. 1.
Figure 3:
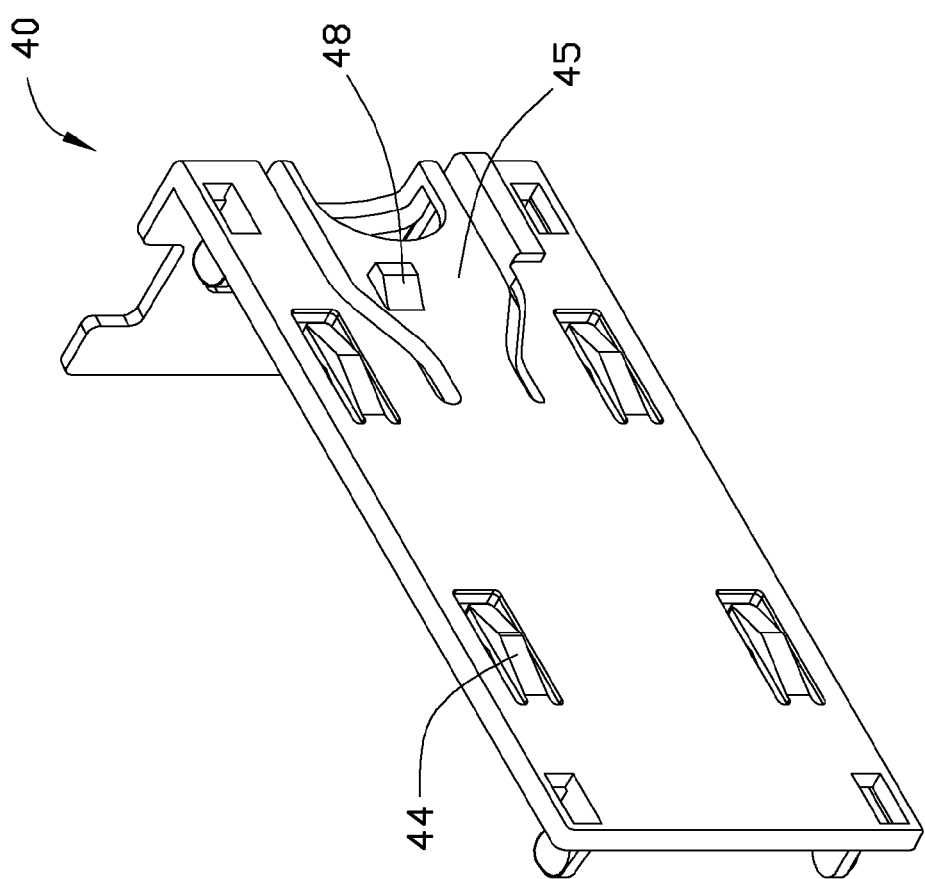
FIG. 3 is an isometric view of the second plate of FIG. 2.

Referring to FIGS. 1, 2, and 3, the first plate 30 and the second plate 40 are for mounting on opposite sides of the fan 20. A first side of the first plate 30, which faces the fan 20, forms four flexible legs 31. Each leg 31 forms a protrusion 32. A second side of the first plate 30, which faces back to the fan 20, forms a plurality of elastic fingers 34. An end of the first plate 30 extends perpendicularly the remainder of the first plate 30 to form a cover 35. A cutout 351 is defined in the cover 35. A plurality of pins 353 is formed on the cover 35.

A first side of the second plate 40, which faces the fan 20, forms four flexible legs 41. Each leg 41 forms a protrusion 42. A second side of the first plate 30, which faces back to the fan 20, forms a plurality of elastic fingers 44. One end of a pull piece 45 is coupled with the second plate 40, and the other end of the pull piece 45 is free. A block 48 is formed on the free end of the pull piece 45.

An adjustable resistor assembly 50 is capable of being mounted on the first plate 30. The assembly 50 includes a first resistor 51, a second resistor 52, a slider 53 capable of sliding within the cutout 351 of the first plate 30, and a cap 54. Each of the first and second resistors 51 and 52 define two through holes 512. The first resistor 51 has a first connection end 513. The second resistor 52 has a second resistor connection end 523. The slider 53 includes two conducting points 531. Each of the power lines 28 and 29 is connected to one conducting point 531. An engaging hole 534 is defined in the slider 53. The cap 54 defines a receiving chamber 541 capable of receiving the slider 53. The cap 54 forms a clasp 542 capable of engaging in the engaging hole 534 of the slider 53.

A power plug 70 is connected to the first connection end 513 of the first resistor 51 by a first line 71, and connected to the second connection end 523 of the second resistor 52 by a second line 72.

Referring to FIG. 4, the rack 80 includes a pair of spaced-apart parallel sidewalls 81 and 83. A plurality of partitions is secured between the sidewalls 81 and 83 to form a plurality of receiving chambers 87 between the sidewall 81 and 83. The receiving chamber 87 is capable of receiving the fan 11 therein. A locking hole 85 is defined in one partition corresponding to the block 48 of the second plate 40.

Referring to FIGS. 1 to 4, in assembly, the pins 353 of the first plate 30 are inserted in the through holes 512 of the first resistor 51 and the second resistor 52. Therefore, the first resistor 51 and second resistor 52 are mounted on the first plate 30. The slider 53 is then located between the first resistor 51 and the second resistor 52 with the conducting points 531 contacting with the first resistor 51 and second resistor 52. A portion of the slider 53, which defines the engaging hole 534, inserts through the cutout 351. The clasp 542 of the cap 54 engages in the engaging hole 534 to mount the cap 54 on the slider 53.

The first line 71 and second line 72 are placed in the line outlet 27 of the fan 11. The legs 31 of the first plate 30 are elastically bent to locate the protrusions 32 in corresponding fixing holes 25 of the fan 11 to mount the first plate 30 on one side of the fan 11. The legs 41 of the second plate 40 are elastically bent to locate the protrusions 42 in corresponding fixing holes 25 of the fan 11 to mount the second plate 40 on the other side of the fan 11.

The fan 11 with the first plate 30 and second plate 40 is positioned in a receiving chamber 87 of the rack 80. The elastic fingers 34 and 44 are elastically deformed by the partitions of the rack 80. The block 48 of the second plate 40 engages in the locking hole 85 to secure the fan 11 in the rack 80. Because the elastic fingers 34 and 44 are elastically deformed, the fan 11 is firmly secured in the rack 80. Then, the power plug 70 can connected to corresponding power source to provide power to the fan 11 to drive the fan 11. The slider 53 can slide between the first and second resistors 51 and 52, to adjust the resistor value of the adjustable resistor assembly. By doing this, the rotation speed of the fan 11 can be adjusted.

In disassembly of the fan 11 from the rack 80, the pull piece 45 of the second plate 40 is bent to disengage the block 48 from the locking hole 85. The fan 11 with the first plate 30 and second plate 40 is pulled out of the receiving chamber 87. Therefore, the fan 11 is disassembled from the rack 80.

It is to be understood, however, that even though numerous characteristics and advantages of the embodiments have been set forth in the foregoing description. Together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A fan assembly, comprising:
    a fan comprising at least one power line;
    a first plate mounted on one side of the fan, the first plate mounting an adjustable resistor assembly thereon, the adjustable resistor assembly connecting the at least one power line to a power source, the adjustable resistor assembly comprising a first resistor and a slider, the slider comprising a conducting point, one end of the first resistor connected to the power source, the at least one power line of the fan connected to the conducting point; wherein the slider is capable of sliding on the first side plate to have the conducting point contacting different parts of the first resistor to vary a resistor value of the adjustable resistor assembly; and
    a rack for receiving the fan and the first plate therein,
    wherein the first plate comprises a cover comprising a plurality of pins, the first resistor comprises a plurality of through holes, and the pins are secured in the through holes, and
    wherein the cover defines a cutout, the slider defines an engaging hole; a portion of the slider defining the engaging hole inserts through the cutout and is slidable in the cutout; the fan assembly further comprising a cap which comprises a clasp, and the clasp engages the engaging hole of the slider.

2. The fan assembly of claim 1, wherein the fan defines a plurality of fixing holes; a first side of the first plate, which faces the fan, forms a plurality of flexible legs thereon, each leg forms a protrusion thereon; and the protrusions engage in the fixing holes.

3. The fan assembly of claim 1, wherein a second side of the first plate, which faces away from the fan, forms a plurality of elastic fingers, and the elastic fingers are elastically deformed by the rack.

4. The fan assembly of claim 3, further comprising a second plate mounted on another side of the fan, wherein a side of the second plate, which faces away from the fan, forms a block thereon; the rack defines a locking hole, and the block engages the locking hole.

5. The fan assembly of claim 4, wherein a pull piece is coupled with the second plate, an end of the pull piece is a free end, and the block is formed on the pull piece.

6. A fan assembly, comprising:
    a fan;
    a first plate and a second plate mounted on opposite sides of the fan;
    a side of the first plate facing away from the fan forms a first plurality of elastic fingers thereon;
    a side of the second plate facing away from the fan forms a second plurality of elastic fingers thereon;
    a pull piece coupled with the second plate and having a free end;
    a block formed on the free end of the pull piece; and
    a rack comprising a receiving chamber and a partition bounding a side of the receiving chamber, the partition defining a locking hole therein, the receiving chamber receiving the fan with the first plate and the second plate therein, the elastic fingers of the first and second plates bent by the rack, and the locking hole receiving the block therein;
    wherein the pull piece is capable of being bent to disengage the block from the locking hole,
    wherein the fan comprises a pair of power lines which connect to a power source by an adjustable resistor assembly,
    wherein the adjustable resistor assembly comprises a first resistor, a second resistor, and a slider; each of the first and second resistors is connected to a power line of the pair of power lines; the slider comprises two conducting points, one of the two conducting points contacts with the first resistor, the other one of the two conducting points contacts with the second resistor, the slider is capable of sliding between the first and second resistors to have the two contacting points contacting different parts of the first and second resistors to vary a resistor value of the adjustable resistor assembly,
    the first plate comprises a cover which comprises a plurality of pins, the first and second resistors comprise a plurality of through holes, the pins are secured in the through holes, and
    wherein the cover defines a cutout, the slider defines an engaging hole; a portion of the slider defines the engaging hole, inserts through the cutout and is slidable in the cutout; the fan assembly further comprising a cap having a clasp, the clasp engaged in the engaging hole of the slider.

7. The fan assembly of claim 6, wherein the fan defines an line outlet, and the pair of power lines are located in the line outlet.

8. The fan assembly of claim 6, wherein the fan defines a plurality of fixing holes; a side of the first plate facing the fan, forms a first plurality of flexible legs thereon; a side of the second plate facing the fan, forms a second plurality of flexible legs thereon; each of the legs of the first and second plates having a protrusion thereon; and the protrusions engage the fixing holes of the fan.

* * * * *

UNITED STATES PATENT AND TRADEMARK OFFICE
CERTIFICATE OF CORRECTION

PATENT NO. : 8,272,852 B2
APPLICATION NO. : 12/712303
DATED : September 25, 2012
INVENTOR(S) : Zhan-Yang Li Page 1 of 1

It is certified that error appears in the above-identified patent and that said Letters Patent is hereby corrected as shown below:

Title Page, below Item (65) insert

-- (30)   Foreign Application Priority Data

Dec. 4, 2009   (CN) ...........................200920316532.0 --

Signed and Sealed this
Twenty-ninth Day of October, 2013

Teresa Stanek Rea
*Deputy Director of the United States Patent and Trademark Office*